(12) United States Patent
Andou et al.

(10) Patent No.: US 10,156,744 B2
(45) Date of Patent: Dec. 18, 2018

(54) DISPLAY DEVICE AND DISPLAY SYSTEM

(71) Applicant: Japan Display Inc., Tokyo (JP)

(72) Inventors: Naohisa Andou, Tokyo (JP); Tomoki Nakamura, Tokyo (JP); Yoshihiro Kanno, Tokyo (JP)

(73) Assignee: Japan Display Inc., Tokyo (JP)

(*) Notice: Subject to any disclaimer, the term of this patent is extended or adjusted under 35 U.S.C. 154(b) by 93 days.

(21) Appl. No.: 15/271,279

(22) Filed: Sep. 21, 2016

(65) Prior Publication Data

US 2017/0097535 A1    Apr. 6, 2017

(30) Foreign Application Priority Data

Oct. 6, 2015 (JP) .................................. 2015-198157

(51) Int. Cl.
*G02F 1/1333* (2006.01)
*H01L 51/00* (2006.01)
*H01L 51/52* (2006.01)

(52) U.S. Cl.
CPC .... *G02F 1/133305* (2013.01); *H01L 51/0097* (2013.01); *H01L 51/524* (2013.01); *H01L 2251/5338* (2013.01)

(58) Field of Classification Search
CPC ........... G02F 1/133305; H01L 51/0097; H01L 51/524; H01L 2251/5338
See application file for complete search history.

(56) References Cited

U.S. PATENT DOCUMENTS

| 8,240,548 | B2* | 8/2012 | Cohen | G09G 3/344 235/375 |
| 9,229,481 | B2* | 1/2016 | Jinbo | G06F 1/1652 |
| 9,425,418 | B2* | 8/2016 | Kwon | H01L 27/3276 |
| 9,639,175 | B2* | 5/2017 | Cho | G06F 1/1652 |
| 9,812,659 | B2* | 11/2017 | Kwon | H01L 51/0097 |
| 2009/0161048 | A1 | 6/2009 | Satake et al. | |
| 2010/0053173 | A1* | 3/2010 | Cohen | G09G 3/344 345/501 |
| 2010/0123160 | A1 | 5/2010 | Hatano et al. | |
| 2011/0057873 | A1* | 3/2011 | Geissler | G06F 1/1626 345/156 |

(Continued)

FOREIGN PATENT DOCUMENTS

| JP | S63-159333 U | 10/1988 |
| JP | 2008-089884 A | 4/2008 |

(Continued)

OTHER PUBLICATIONS

Lim et al., KR20150064337 A machine translation.*

(Continued)

*Primary Examiner* — Peter D McLoone
(74) *Attorney, Agent, or Firm* — Typha IP LLC

(57) ABSTRACT

A display device in an embodiment according to the present invention includes a display region arranged above a flexible substrate, the display region including a first display region and a second display region continuing from the first display region, at least the second display region including a curved surface. The second display region is located at a position where an image displayed in the second display region is not seen directly when viewing the first display region from a perpendicular direction with respect to a center part of the first display region.

18 Claims, 16 Drawing Sheets

(56) References Cited

U.S. PATENT DOCUMENTS

| | | | | |
|---|---|---|---|---|
| 2014/0015743 | A1* | 1/2014 | Seo | G06F 1/1694 345/156 |
| 2014/0029017 | A1* | 1/2014 | Lee | G01B 11/24 356/601 |
| 2015/0177789 | A1* | 6/2015 | Jinbo | G06F 1/1652 313/511 |
| 2015/0355728 | A1* | 12/2015 | Cho | G06F 1/1652 345/173 |
| 2016/0014403 | A1* | 1/2016 | Stroetmann | G06F 1/1641 348/53 |
| 2016/0093685 | A1* | 3/2016 | Kwon | H01L 27/3276 257/40 |
| 2016/0336523 | A1* | 11/2016 | Kwon | H01L 27/3276 |
| 2017/0098794 | A1* | 4/2017 | Cho | B05D 7/50 |
| 2017/0131803 | A1* | 5/2017 | Browning | G06F 3/041 |
| 2017/0199549 | A1* | 7/2017 | Yeom | G06F 1/1652 |
| 2017/0205927 | A1* | 7/2017 | Lee | H01L 27/323 |
| 2017/0351351 | A1* | 12/2017 | Kim | G06F 3/041 |
| 2018/0040647 | A1* | 2/2018 | Yamazaki | H01L 29/7869 |
| 2018/0062094 | A1* | 3/2018 | Kwon | H01L 27/323 |
| 2018/0074553 | A1* | 3/2018 | Yamazaki | G06F 1/1652 |

FOREIGN PATENT DOCUMENTS

| | | |
|---|---|---|
| JP | 2009-150982 A | 7/2009 |
| JP | 2011-183916 A | 9/2011 |
| JP | 2014-187695 A | 10/2014 |
| KR | 10-2009-0067089 A | 6/2009 |
| KR | 10-2010-0094065 A | 8/2010 |
| KR | 10-2015-0064337 A | 6/2015 |

OTHER PUBLICATIONS

Kim, KR 10149806181 machine translation.*
Korean Office Action dated Dec. 15, 2017 for corresponding Korean Application No. 10-2016-0126151, with partial translation.
Japanese Office Action dated May 22, 2018 for corresponding Japanese Application No. 2015-198157. With partial English translation.
Korean Office Action dated Jun. 12, 2018 for corresponding Korean Application No. 10-2016-0126151, with partial translation.

* cited by examiner

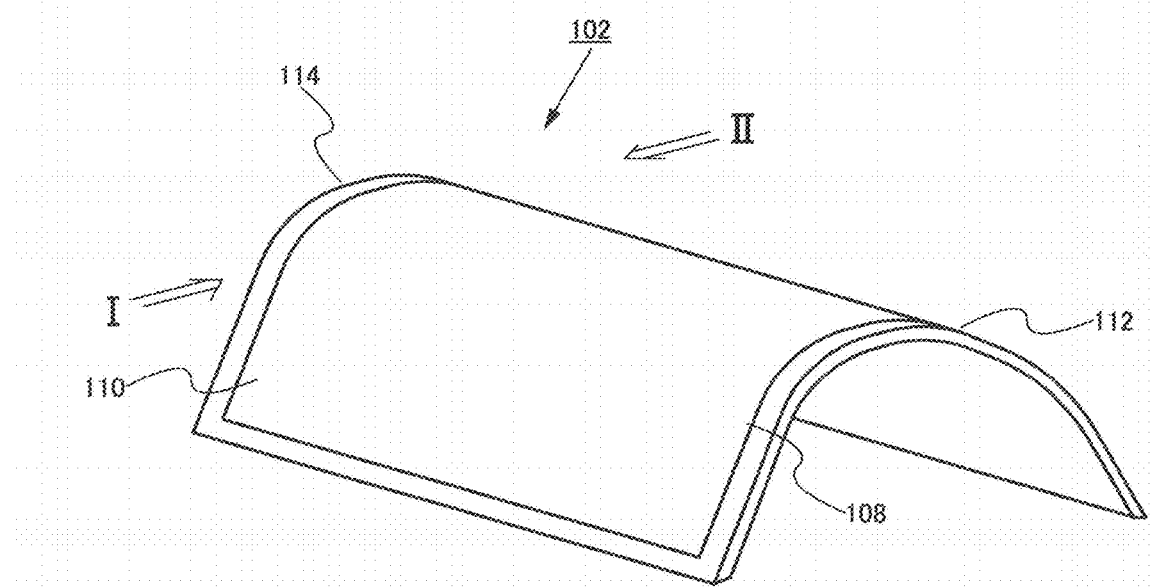

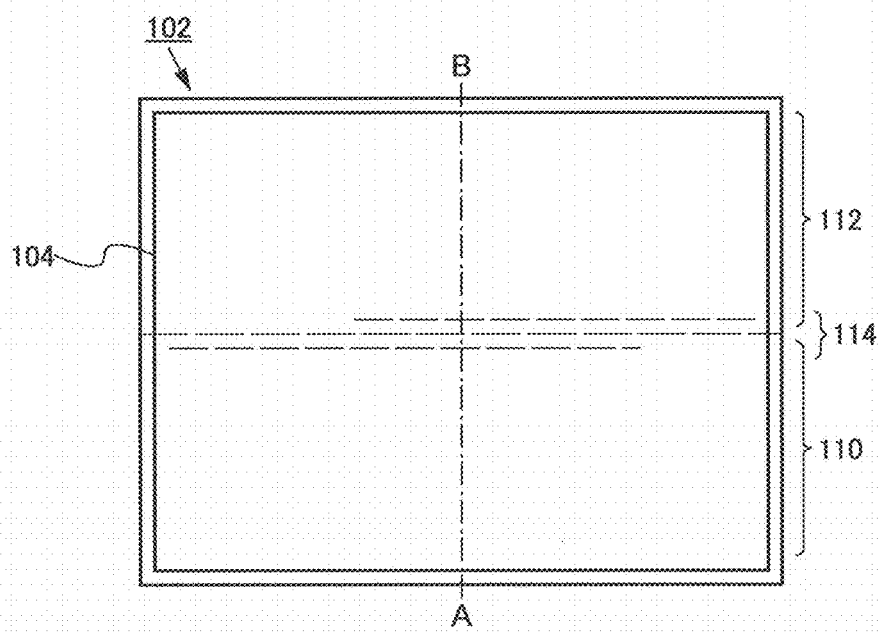

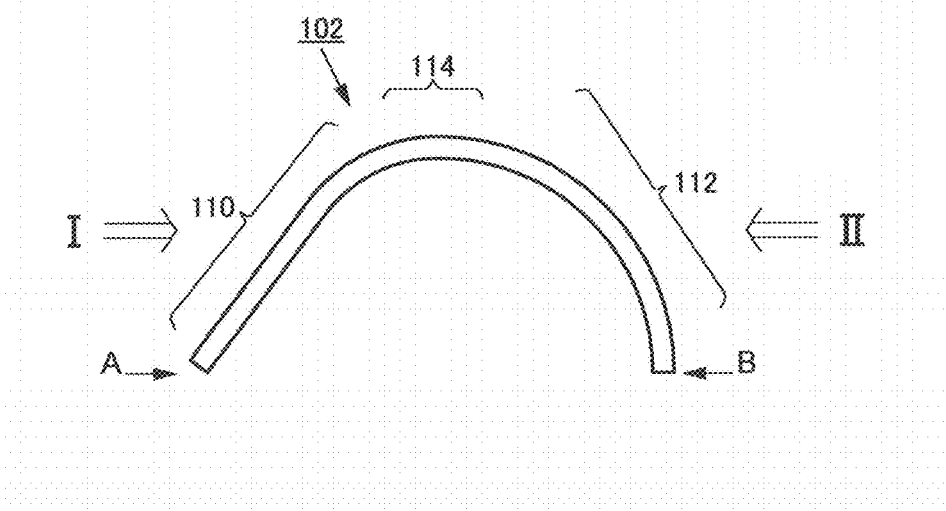

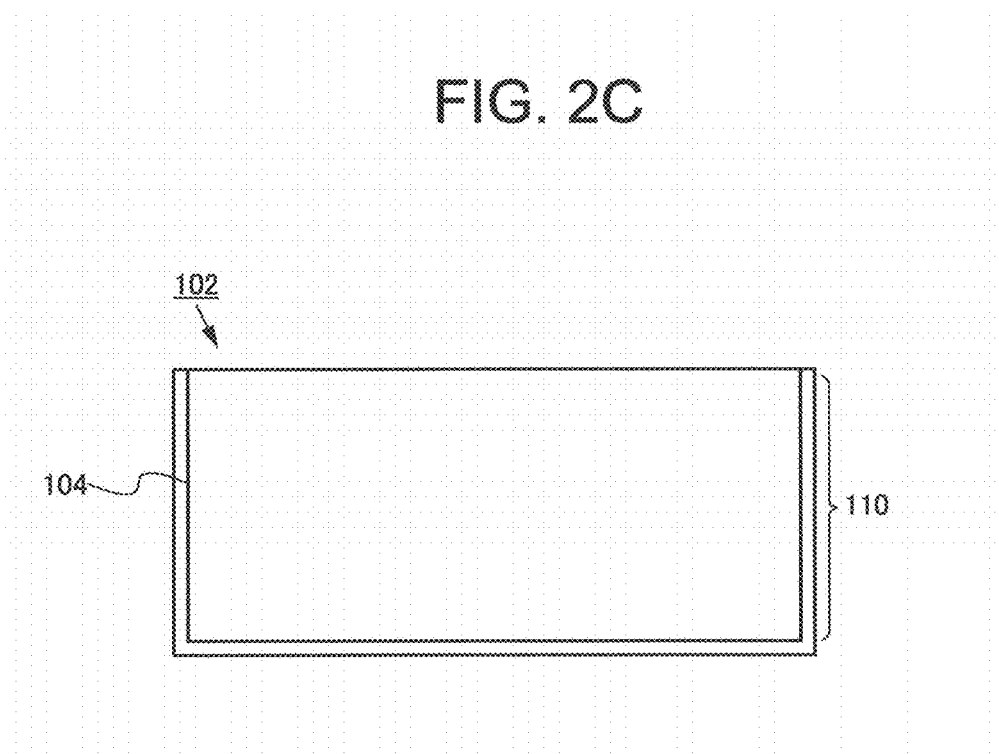

DISPLAY DEVICE AND DISPLAY SYSTEM

CROSS-REFERENCE TO RELATED APPLICATIONS

This application is based upon and claims the benefit of priority from the prior Japanese Patent Application No. 2015-198157, filed on Oct. 6, 2015, the entire contents of which are incorporated herein by reference.

FIELD

The present invention is related to a display device and a structure of a display region displaying an image in a display system.

BACKGROUND

Flexible displays are being developed in which a display region is formed in a substrate having flexibility. A flexible display can display an image even in a state where the display region is curved. A vehicle mounted display system attached with a flexible display to an installment panel of the vehicle is disclosed in Japanese Laid Open Patent Publication No. 2011-183916 as one example where the flexibility of a flexible display is utilized.

However, while a conventional flexible display includes a feature where it is possible to curve or bend a substrate, this feature is not sufficiently utilized with respect to displaying video.

SUMMARY

A display device in an embodiment according to the present invention includes a display region arranged above a flexible substrate, the display region including a first display region and a second display region continuing from the first display region, at least the second display region including a curved surface. The second display region is located at a position where an image displayed in the second display region is not seen directly when viewing the first display region from a perpendicular direction with respect to a center part of the first display region.

A display system in an embodiment according to the present invention includes a display device including display region arranged above a flexible substrate, the display region including a first display region and a second display region continuing from the first display region and including a curved surface; and a projection surface facing the second display region. An image display displayed in the second display region is projected on the projection surface.

BRIEF DESCRIPTION OF DRAWINGS

FIG. 1 is a perspective view diagram showing a structure of a display device related to one embodiment of the present invention;

FIG. 2A is a planar view diagram showing a display device related to one embodiment of the present invention;

FIG. 2B is a cross-sectional diagram showing a display device related to one embodiment of the present invention;

FIG. 2C is a front surface view diagram showing a display device related to one embodiment of the present invention;

DESCRIPTION OF EMBODIMENTS

Figure 3A:
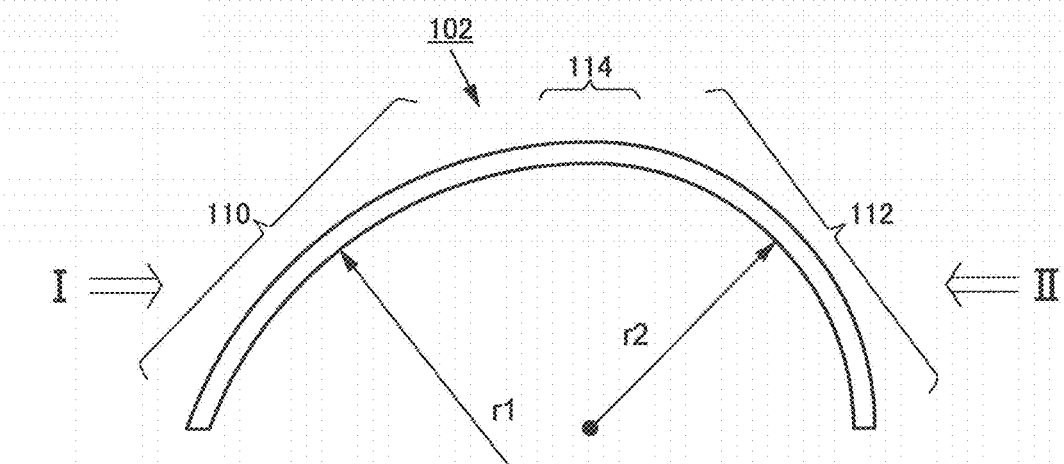
FIG. 3A is a cross-sectional diagram for explaining a structure of a display device related to one embodiment of the present invention.

The embodiments of the present invention are explained below while referring to the diagrams. However, it is possible to perform the present invention using various different forms and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. In addition, in the specification and each drawing, the same reference symbols are attached to similar elements and elements that have been mentioned in previous drawings, and therefore a detailed explanation may be omitted where appropriate.

In the present specification, in the case where certain parts or regions are given as "above (or below)" other parts or regions, as long as there is no particular limitation, these include parts which are not only directly above (or directly below) other parts or regions but also in an upper direction (or lower direction), that is, other structure elements may be included between other parts or regions in an upper direction (or lower direction).

First Embodiment

1. First Structure of a Display Device

The display device related to one embodiment of the present invention includes flexibility and a structure in which one part of a display region bends. FIG. 1 shows a perspective view of a display device 102 related to one embodiment of the present invention. FIG. 2A shows a planar view of the display device 102. FIG. 2B shows a cross-sectional view along the line A-B shown in FIG. 2A. In addition, FIG. 2C shows a front surface view seen from a first side shown in FIG. 2B. These diagrams are referred to when appropriate in the explanation below.

Furthermore, in the present specification, for the purpose of convenience, one side when viewing the display device 102 is referred to as the first side and an opposing side (opposite side) is referred to as the second side.

The display device 102 includes a display region 108. The display region 108 includes at least a first display region 110 and a second display region 112. At least one part of a region of the display region 108 forms the first display region 110 and the remaining regions form the second display region 112. Furthermore, the first display region 110 and second display region 112 do not have to be clearly sectioned by display regions and the first display region 110 and second display region 112 are arranged continuously. One region of the first display region 110 and second display region 112 in the display region 108 may overlap. That is, the boundary between the first display region 110 and second display region 112 in the display region 108 does not have to be clearly defined and a boundary region may be present between the first display region 110 and second display region 112. For example, a boundary region may be present between the first display region 110 and second display region 112 in which images to be displayed in the first display region 110 and second display region 112 respectively are mixed. By including the first display region 110 and second display region 112 in the display region 108, it is possible to realize new visual effects when displaying an image.

The display device 102 bends so that the display region 108 includes a convex surface on the exterior side. A bent part 114 is present in a region which includes a boundary region between the first display region 110 and second display region 112. By including the bent part 114, it is possible to view the first display region 110 from a first side when the display device 102 is placed on a substrate. In this case, the second display region 112 is arranged on the rear surface side of the first display region 110. As is shown in FIG. 2B, the first display region 110 is arranged on a flat surface of the display region 108 and the second display region 112 is arranged on a curved surface. The display device 102 includes a curved surface from the boundary region between the first display region 110 and second display region 112 to the second display device 112. In this case, the curvature of the bent part 114 in the boundary region is at its largest compared to the curvature of the curved surface of the second display region 112. In this way, when the display device 102 is viewed from the first side, it is possible for the second display region 112 to be arranged on the rear surface of the first display region 110. Furthermore, it is possible to provide a sense of an integrated display region 108 which includes the first display region 110 and second display region 112 with respect to a viewer, and display different images in both display regions without a feeling of awkwardness.

When a viewer views the display device from the first side, it is possible to directly see an image displayed in the first display region 110. In this case, since the second display region 112 is located on the rear surface side of the first display region 110, it is not always possible for a viewer to directly see the second display region 112. For example, when the first display region 110 is viewed from a perpendicular direction with respect to a center part of the first display region 110, the second display region 112 is located in a position in which an image displayed in the second display region 112 cannot be directly seen. However, in the case where a projection surface is arranged on the rear surface of the display device 102, an image displayed by the second display region 112 can be viewed by a viewer on the projection surface. In addition, an image displayed in the second display region 112 can be viewed from the upper surface of the display device 102 or from the second side.

Furthermore, the first display region 110 is arranged with a light emitting element such as a lenticular lens and may be configured so that three dimensional images can be viewed. In addition, a touch sensor may be arranged in the display region 108 and configured so as to function as a touch panel. For example, by adding a touch panel function to the first display region 110, it is possible to use the display device 102 as an input device.

As one example, the display device 102 is formed with the first display region 110 in a flat region of the display region 108. By forming the first display region 110 on a flat screen, it is possible to increase visibility of a direct view image. On the other hand, the display device 102 is formed with the second display region 112 in a region including a curved surface of the display region 108. By forming the second display region 112 on a curved screen, it is possible to provide different visual effects from images displayed by the first display region 110 when viewing the second display region 112 from the second side. In addition, in the case where the second display region 112 projects an image on to a projection surface, it is possible to expand the projection. In this way, by setting one of the display regions 108 sandwiching the bent part 114 as a flat region and the other as a curved surface, it is possible increase visibility of a direct view image and create new video effects.

Although a form is shown in FIG. 1 in which one edge of the first display region 110 side and one edge of the second display region 112 side in the display device 102 are arranged horizontally contacting a ground surface, the present invention is not limited to this form and one edge which intersects each of the edges mentioned above (edge on a side in common with the first display region 110 and second display region 112) may be arranged contacting a ground surface. In other words, the display device 102 shown arranged horizontally in FIG. 1 may also be arranged vertically. Even when the display device 102 is arranged vertically, if the first display region 110 is arranged to be viewed from the first side, the same effects are exhibited as when arranged horizontally.

According to the present embodiment, by arranging the first display region 110 and second display region 112 sandwiching the bent part 114 in the display region 108 of the display device 102 having flexibility, it is possible to directly view one of the display regions and not directly view the other display region. In this way, it is possible to display an image in at least two different directions. In addition, when a projection surface is present on a rear surface of the second display region 112, it is possible to project an image displayed by the second display region 112 onto the projection surface. In this way, according to one embodiment of the present invention, by forming a plurality of display regions in a display region including a bent part, it is possible to provide a display device which realizes new visual effects.

2. Second Structure of a Display Device

Figure 3B:
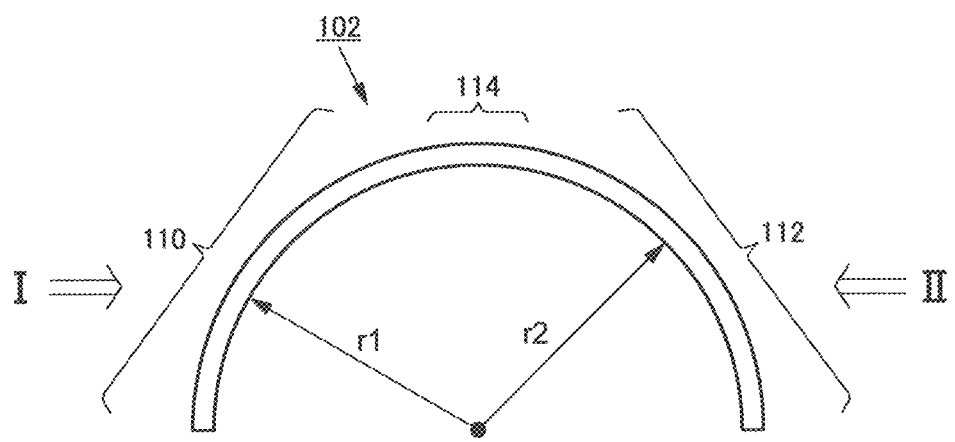
FIG. 3B is a cross-sectional diagram for explaining a structure of a display device related to one embodiment of the present invention.

As is shown in FIG. 3A and FIG. 3B, the display device 102 may be formed with the first display region 110 in a region including a curved surface of the display region 108 as another form. That is, both the first display region 110 and second display region 112 may include a curved surface. By providing the first display region 110 with a curved surface, it is possible to widen a viewing angle in at least a curve direction.

As is shown in FIG. 3A, the curvature of the curved surface of the second display region 112 may be set larger than the curvature of the curved surface of the first display region 110. In other words, a curvature radius r1 of the first display region 110 may be larger than a curvature radius r2 of the second display region 112. By providing this type of structure, it is possible to project an image at a wide angle in the second display region 112 without reducing visibility of a direct view image while continuing to realize a wide viewing angle in the first display region 110.

As is shown in FIG. 3B, the first display region 110 and second display region 112 may include the same curvature radius (r1=r2). In this way, it is possible to reduce the arrangement area of the display device while widening a viewing angle and continue to improve visibility.

Figure 4:
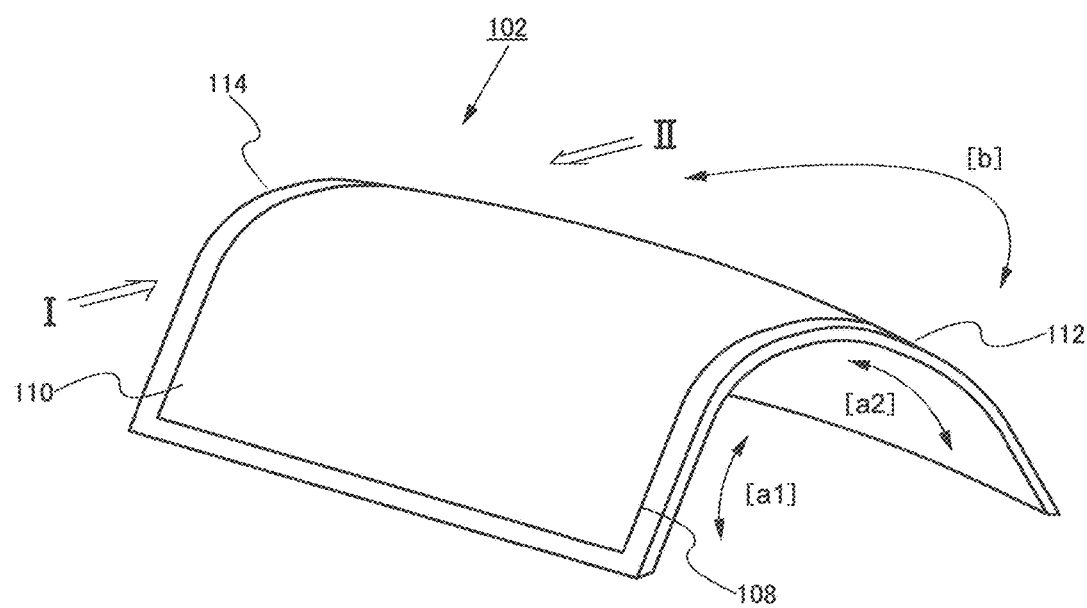
FIG. 4 is a perspective view diagram showing a structure of a display device related to one embodiment of the present invention.

As is shown in FIG. 4, in the display device 102, the second display region 112 or the first display region 110 and second display region 112 may be curved not only in a height direction ([a1], [a2] direction shown in FIG. 4) but also in a width direction ([b] direction shown in FIG. 4). When at least the second display region 112 also curves in a width direction, it is possible to expand a projection surface when the second display region 112 projects an image.

Furthermore, in the present embodiment, a curved surface of the first display region 110 and second display region 112 is not limited to the curved surface including a constant curvature radius shown in FIG. 3A and FIG. 3B and may also include a curvature which continuously changes. In either case, by providing a first display region and second display region with a curved surface, it is possible to provide a display device which realizes new visual effects.

3. Substrate Structure

Figure 5A:
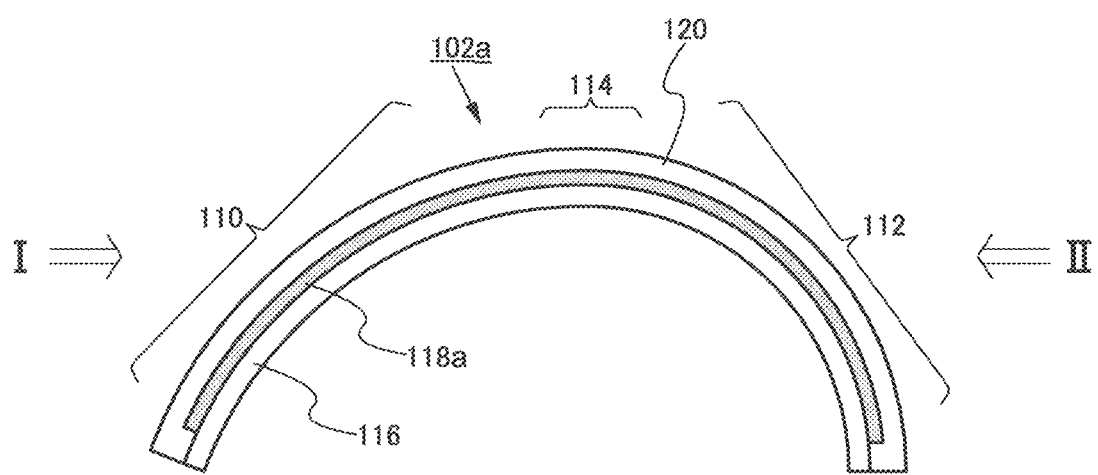
FIG. 5A is a cross-sectional diagram showing a structure of a display device related to one embodiment of the present invention.
Figure 5B:
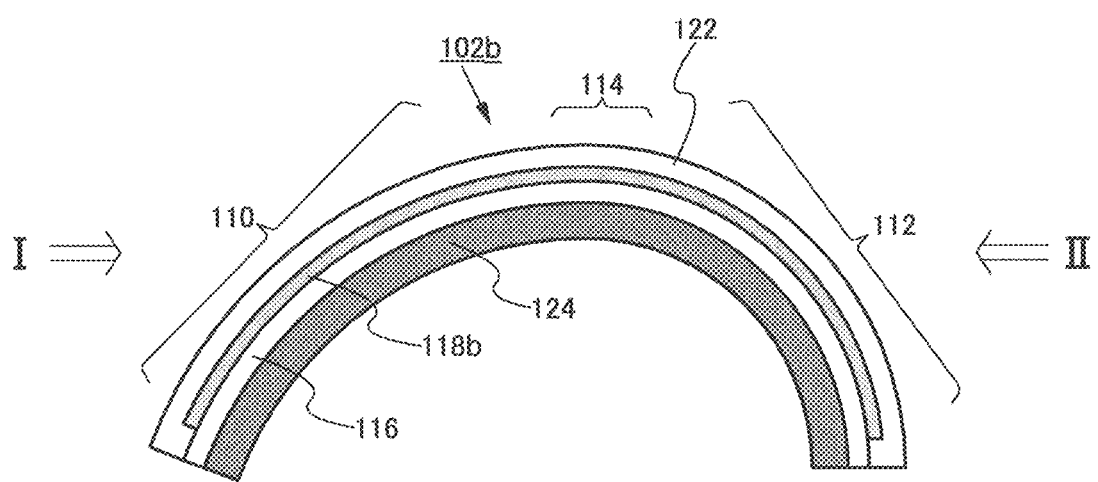
FIG. 5B is a cross-sectional diagram showing a structure of a display device related to one embodiment of the present invention.

FIG. 5A and FIG. 5B are cross-sectional diagrams showing a substrate structure in the display device 102 related to the present invention. FIG. 5A shows the case of an organic electroluminescence display device 102a. A display element part 118a is arranged in a first substrate 116 and a sealing member 120 is arranged to cover the display element part 118a. The first substrate 116 has flexibility. An organic resin film substrate, a thin plate glass substrate or a compound substrate in which an organic resin film is attached to a thin plate glass substrate may be used as the substrate having flexibility. The display element part 118a is arranged with an organic electroluminescence element in each pixel. The sealing member 120 is formed by a sealing layer in which the same type of substrate as the flexible substrate used for the first substrate or an inorganic insulation layer and organic resin layer are stacked. In the organic electroluminescence display device 102a, the display element part 118a is formed with the display region 108 which includes the first display region 110 and second display region 112 and displays and image when an organic electroluminescence element emits light.

FIG. 5B shows the case of a liquid crystal display device 102b. The liquid crystal display device 102b is arranged with a display element part 118b including liquid crystal elements between the first substrate 116 and a second substrate 122. In addition, a back light 124 is arranged on the first substrate 116 side. The flexible substrates described above may be used for the first substrate 116 and second substrate 122. The liquid crystal elements arranged in the display element part 118b include liquid crystal elements arranged with a liquid crystal layer between a pair of electrodes, and an image is display by controlling the transmission of light emitted from the back light 124 due to the electro-optical effects of the liquid crystals.

In either case, by arranging a display element part using a substrate having flexibility, it is possible to provide a display device including a display region having the first display region and second display region shown in the present embodiment.

4. Structure of a Pixel

Figure 6:
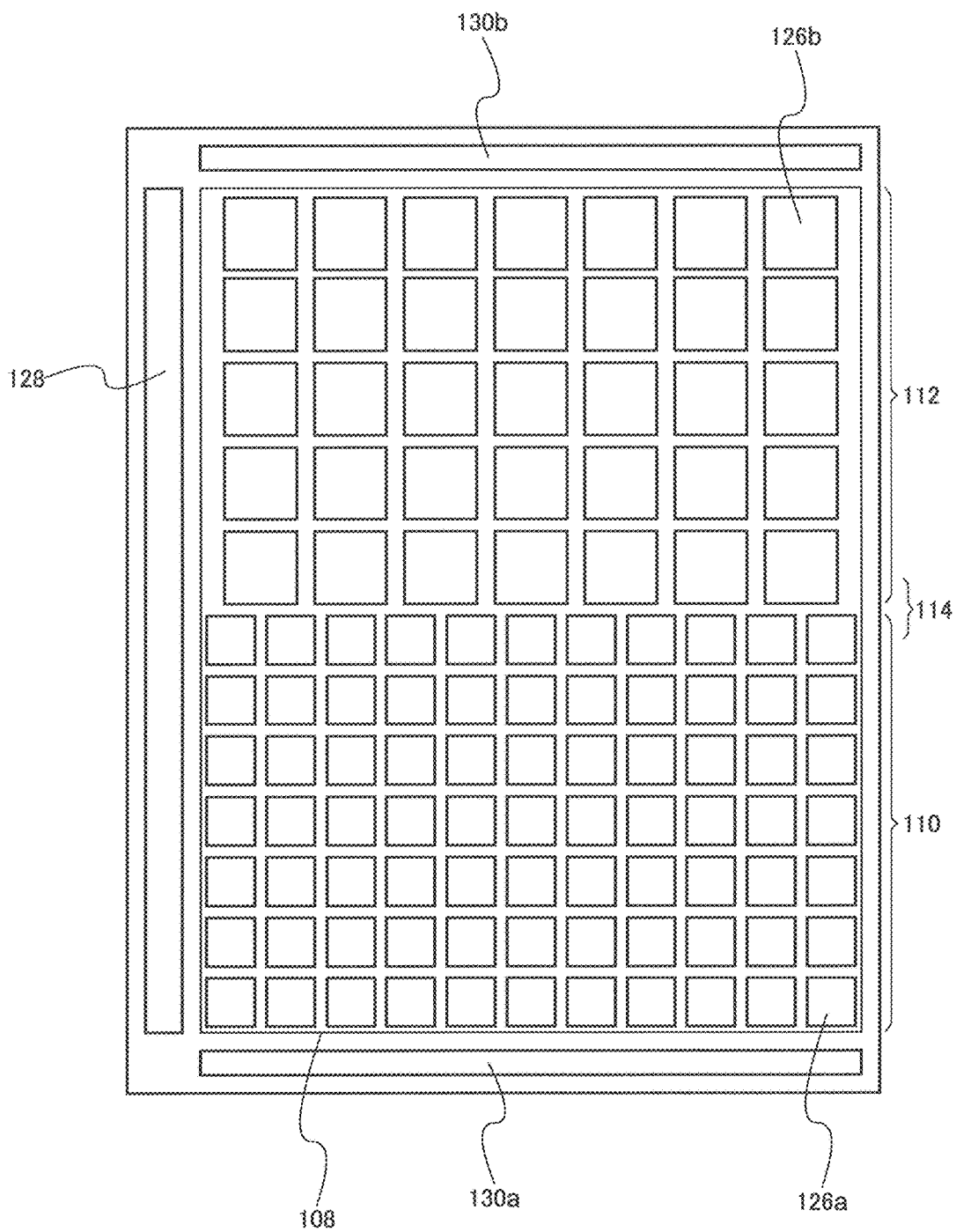
FIG. 6 is a diagram showing a structure of a display region of a display device related to one embodiment of the present invention.

FIG. 6 shows a structure of the display region 108 in the display device 102 related to the present invention. The display region 108 includes the first display region 110 and second display region 112. The first display region 110 and second display region 112 are arranged continuously. In the display region 108 shown in FIG. 6, the first display region 110 is arranged with a plurality of first pixels 126a. The second display region 112 is arranged with a plurality of second pixels 126b. A pixel pitch of the first pixels 126a in the first display region 110 and a pixel pitch of the second pixels 126b in the second display region 112 are different. That is, pixel density in the first display region 110 is higher than pixel density in the second display region 112. In other words, the resolution of the first display region 110 and second display region 112 is different. Specifically, the pixel pitch in the first display region 110 is smaller compared to the pixel pitch in the second display region 112. For example, in the case where the pixel pitch in the first display region 110 is 500 ppi (pixel per inch) or more, it is sufficient that the pixel pitch in the second display region 112 is less than 500 ppi. Furthermore, a configuration is also possible in which the pixel size in the first display region 110 is formed smaller than the pixel size in the second display region 112.

It is possible to increase resolution by reducing the pixel pitch in the first display region 110. It is possible to display a high resolution image in the display region 110 which displays a direct view image. On the other hand, by making the pixel pitch in the second display region 112 larger than the pixel pitch in the first display region 110, it is possible to improve an aperture ratio of a pixel and increase luminosity per pixel. In this way, it is possible to increase contrast of an image displayed on a projection surface when an image is projected by the second display region 112.

Furthermore, the display device 102 shown in FIG. 6 is arranged with a drive circuit for driving the first display region 110 and second display region 112. The drive circuit includes one or both of a scanning line drive circuit 128 and data line drive circuit 130 (shown as 130a, 130a in FIG. 6). The scanning line drive circuit 128 outputs a scanning signal to the first display region 110 and second display region 112. The scanning line drive circuit 128 may also be arranged individually corresponding to the first display region 110 and second display region 112.

The data line drive circuit 130 outputs a data signal for displaying an image to the first display region 110 and second display region 112. In the case where the pixel pitches of the first display region 110 and second display region 112 are different, a first data line drive circuit 130a and second data line drive circuit 130b may be arranged corresponding to each display region. It is possible to display different images in both display regions by arranging a data line drive circuit 130 corresponding to the first display region 110 and second display region 112. That is, by separately arranging a drive circuit in the first display region 110 and second display region 112, it is possible to simultaneously display different images. In addition, it is possible to display a still image in one of either the first display region 110 and second display region 112 and display video in the other display region.

Furthermore, the arrangement of pixels in the first display region 110 and second display region 112 is arbitrary and in addition to a square arrangement in a matrix shape, a delta arrangement or pentile arrangement may also be used.

Figure 7:
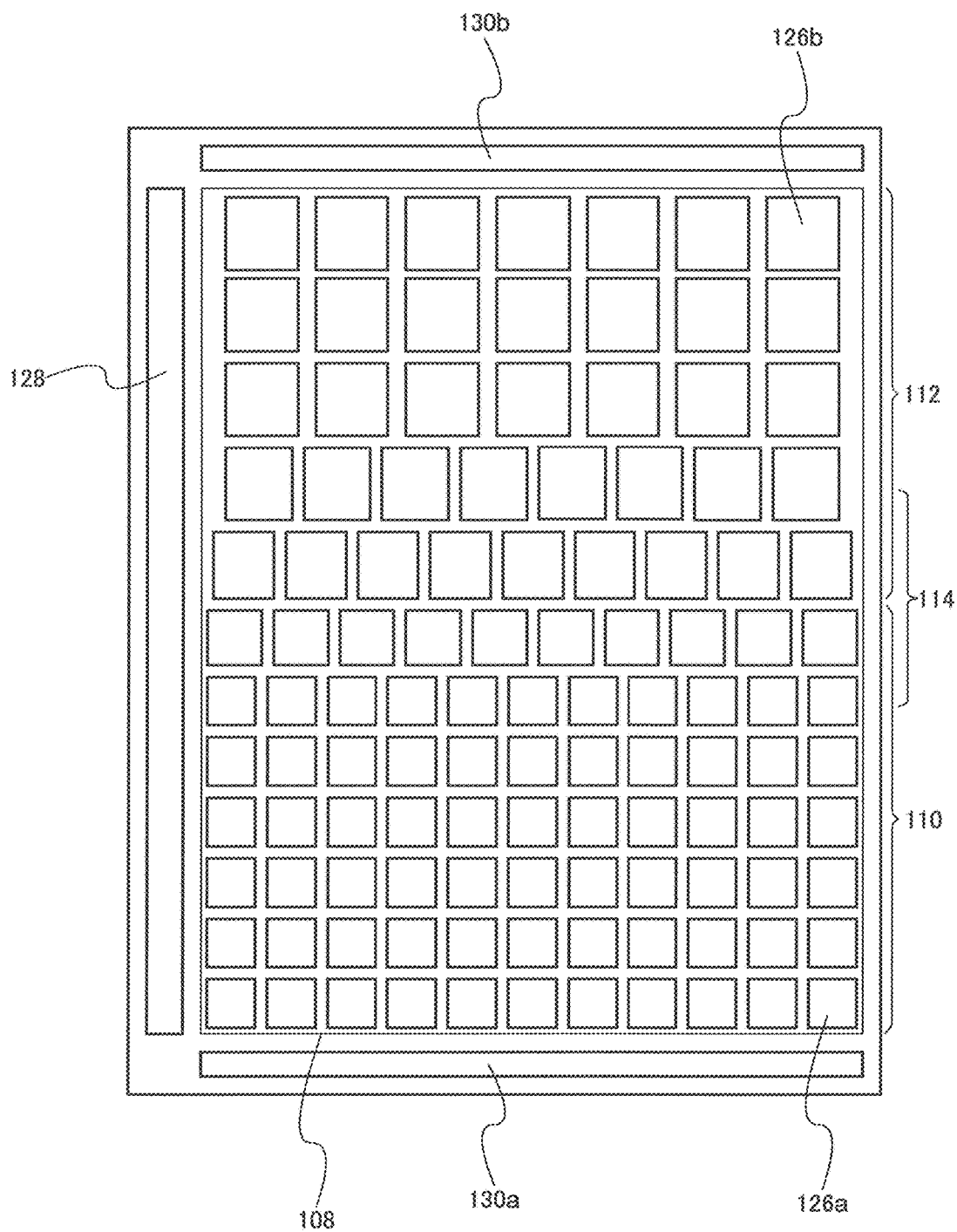
FIG. 7 is a diagram showing a structure of a display region of a display device related to one embodiment of the present invention.

FIG. 7 shows another structure of the display region 108. A boundary region in which pixel pitch changes gradually is included in the boundary region between the first display region 110 and second display region 112. That is, the display region 108 includes a boundary region in which pixel pitch increases from the display region 110 which has a small pixel pitch towards the second display region 112 which has a larger pixel pitch than the first display region 110. In other words, among the first display regions 110, a pixel pitch in a region adjacent to the second display region 112 is formed larger than a pixel pitch in other first display regions 110, and among the second display regions 112, a pixel pitch in a region adjacent to the first display region 110 is formed smaller than a pixel pitch in other second display regions 112. Alternatively, among the first display regions 110, the size of a pixel adjacent to the second display region 112 is formed larger than the size of a pixel in other first display regions 110, and among the second display regions 112, the size of a pixel adjacent to the first display region 110 is formed smaller than the size of a pixel in other second display regions 112. In this boundary region, the pixel pitch may change for each row or a plurality of rows so that the pixel pitch becomes larger in steps. In this way, by arranging a boundary region having different pixel pitches, it is not possible to ensure that a boundary between the first display region 110 and second display region 112 cannot be clearly viewed and it is possible provide a viewer with a sense of an integrated display region 108 as a visual effect.

In the boundary region between the first display region 110 and second display region 112 in the display region 108 shown in FIG. 6 and FIG. 7, a configuration is possible in which display is performed which does not belong to either an image displays in the first display region 110 or an image displayed in the second display region 112. For example, the boundary region of the display region 108 is a display in which a clear image is not recognized and display is performed in which luminosity, saturation, color and gradation continuously change with time. In this way, it is possible for a viewer to clearly identify a boundary between the first display region 110 and second display region 112 and clearly view the display of the display region 110.

In the display region 108 shown in FIG. 6 and FIG. 7, the first display region 110 may include a first light emitting region and the second display region 112 may include a second light emitting region. The first light emitting region can be formed using a light emitting element as a display element in each first pixel 126a which forms the first display region 110. This is also the same for the second light emitting region. It is possible to use an organic electroluminescence element as the light emitting element interposed by an organic layer including an organic electroluminescence material between a pair of electrodes for example. In this case, as is shown in FIG. 6 and FIG. 7, by also arranging similar pixels in the boundary region between the first display region 110 and second display region 112, it is possible to not include a non-light emitting region. In this way, it is possible to provide a sense of an integrated display region 108 to a viewer and leave a refined impression.

Figure 8:
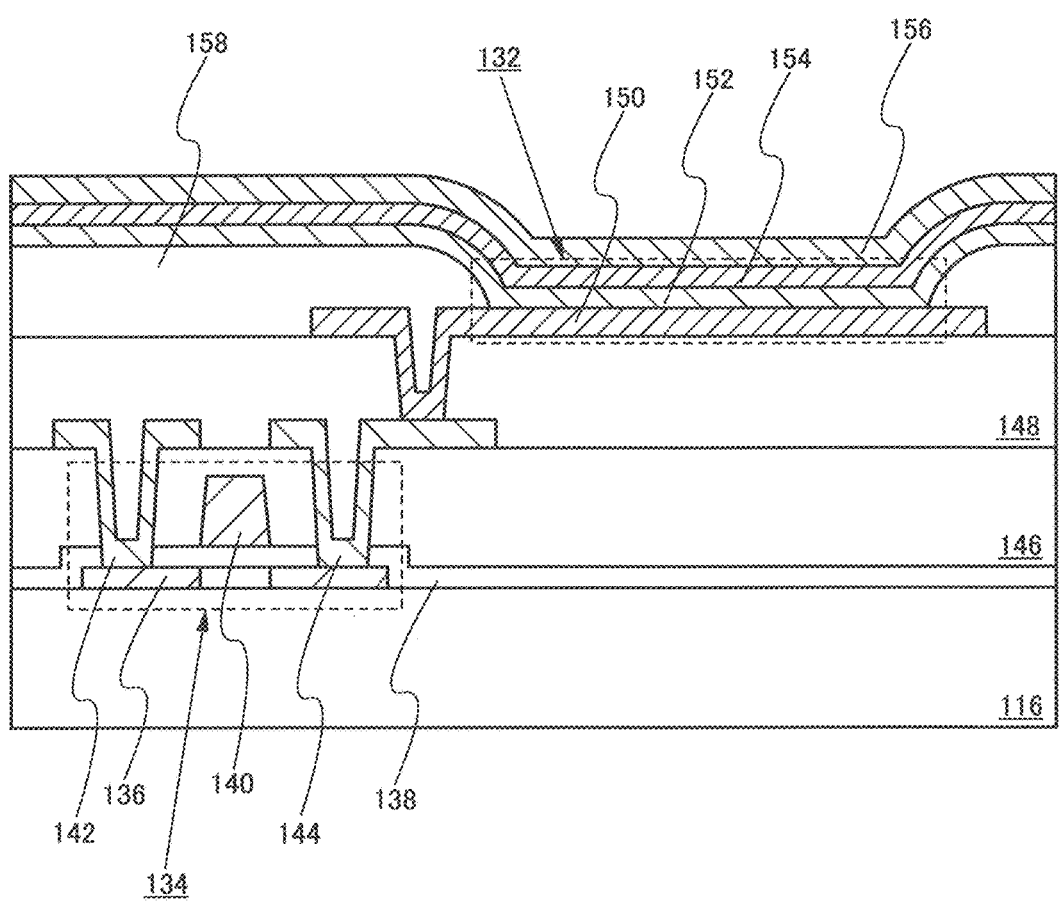
FIG. 8 is a cross-sectional diagram showing an example of a pixel of a display device related to one embodiment of the present invention.

FIG. 8 shows an example of a pixel (first pixel 126a and second pixel 126b) arranged with a light emitting element.

FIG. 8 shows an example of a cross-sectional structure of a pixel 126. Pixel 126 includes a light emitting element 132 and a drive transistor 134 for driving the light emitting element 132.

The drive transistor 14 is arranged in the first substrate 116. The drive transistor 134 is formed including a semiconductor layer 136, gate insulation layer 138 and gate electrode 140. An amorphous or polycrystalline silicon semiconductor or oxide semiconductor using the semiconductor properties of a metal oxide are used for the semiconductor layer 136 of the drive transistor 134. The drive transistor 134 is formed with a channel in a region in which the semiconductor layer 136 overlaps the gate electrode 140 and is arranged with a source region and drain region sandwiching the channel.

A source electrode 142 and drain electrode 144 are arranged sandwiching a first interlayer insulation layer 146. The source electrode 142 and drain electrode 144 are respectively connected to the source region and drain region of the semiconductor layer 136 via a contact hole which passes through the first interlayer insulation layer 146 and gate insulation layer 138. A second interlayer insulation layer 148 is arranged in an upper layer of the source electrode 142 and drain electrode 144.

The light emitting element 132 includes a pixel electrode 150, organic layer 152 and opposing electrode 154. Among this pair of electrodes, the pixel electrode 150 is the anode and the opposing electrode 154 is the cathode. A bank layer 158 is arranged so as to enclose the pixel electrode 150. The organic layer 152 is arranged from the pixel electrode 150 to the bank layer 158. The organic layer 152 includes a light emitting material such as a low molecular or high molecular electroluminescence material. In the case where a low molecular organic material is used as the light emitting material, in addition to a light emitting layer including an organic material with light emitting properties, the organic layer 152 may be formed including a hole injection layer and electron injection layer sandwiching the light emitting layer and may further include a hole transport layer and electron transport layer.

Furthermore, the pixel 126 includes what is called a top-emission type structure in which light emitted by the light emitting element 132 is emitted to the opposing electrode 154 side. In this case, the pixel electrode 150 is preferred to be formed from a metal film having high reflectance or a stacked layer film including such a metal film since the light emitted by the organic layer 152 is reflected to the opposing electrode side. On the other hand, the opposing electrode 154 is preferred to be formed from a transparent conductive film.

A passivation layer 156 is arranged in an upper layer of the light emitting element 132. Although there is no limitation to the passivation layer 156, a stacked structure of an insulation layer formed from an inorganic insulation material and an insulation layer formed from an organic resin material may be used. The passivation layer 156 covers the light emitting element 132 and is arranged in order to prevent the infiltration of water and the like. In the case of the top-emission type structure shown in FIG. 8, the passivation layer 156 is preferred to include translucency using a cover film such as silicon nitride or aluminum oxide. In addition, a second substrate may be arranged in an upper part of the passivation layer 156 and a filler material may be arranged therebetween.

In this way, it is possible to form a light emitting region in the first display region 110 and a second light emitting region in the second display region 112 by using the first pixel 126a which forms the first display region 110 and second pixel 126b which forms the second display region 112 to form a structure including a light emitting element. In this way, it is possible to obtain a thin display device 102 and arranging a curved surface in a display region becomes easy. Furthermore, even when a curved surface is arranged in the first display region 110 and second display region 112, it is possible to reduce reliance on a viewing angle and form a display region with a high viewing angle.

Furthermore, although a form is exemplified in the present embodiment in which two display regions are arranged in the display region 108, the present invention is not limited to two display regions and may be divided even further. For example, a part of the first display region 110 may be sectioned and a third display region may be arranged. The same is true for the second display region 112, for example, a third display region which displays video may be included inside a region which displays still images as the second display region 112. In this way, by functionally dividing the display region 108, it is possible to obtain a display which realizes new visual effects.

In the display device related to one embodiment of the present invention, by making a pixel pitch different between a first display region and a second display region, it is possible to make the resolution of pixels different between an image directly viewed in a display region and an image (projected image for example) which is not directly viewed. In this way, it is possible to display an image which realizes new visual effects by combining a high resolution image and a projected image which encloses the high resolution image. In addition, since the display device related to one embodiment of the present invention is not arranged with a physical obstacle in a boundary between the first display region 110 and second display region 112, it is possible to continue to provide a sense of an integrated display region to a viewer and provide different displays using at least two display regions.

Second Embodiment

The present embodiment shows an example of a display system using the display device shown in the first embodiment. The display system related to one embodiment of the present invention is arranged with a display device and a projection surface.

Figure 9:
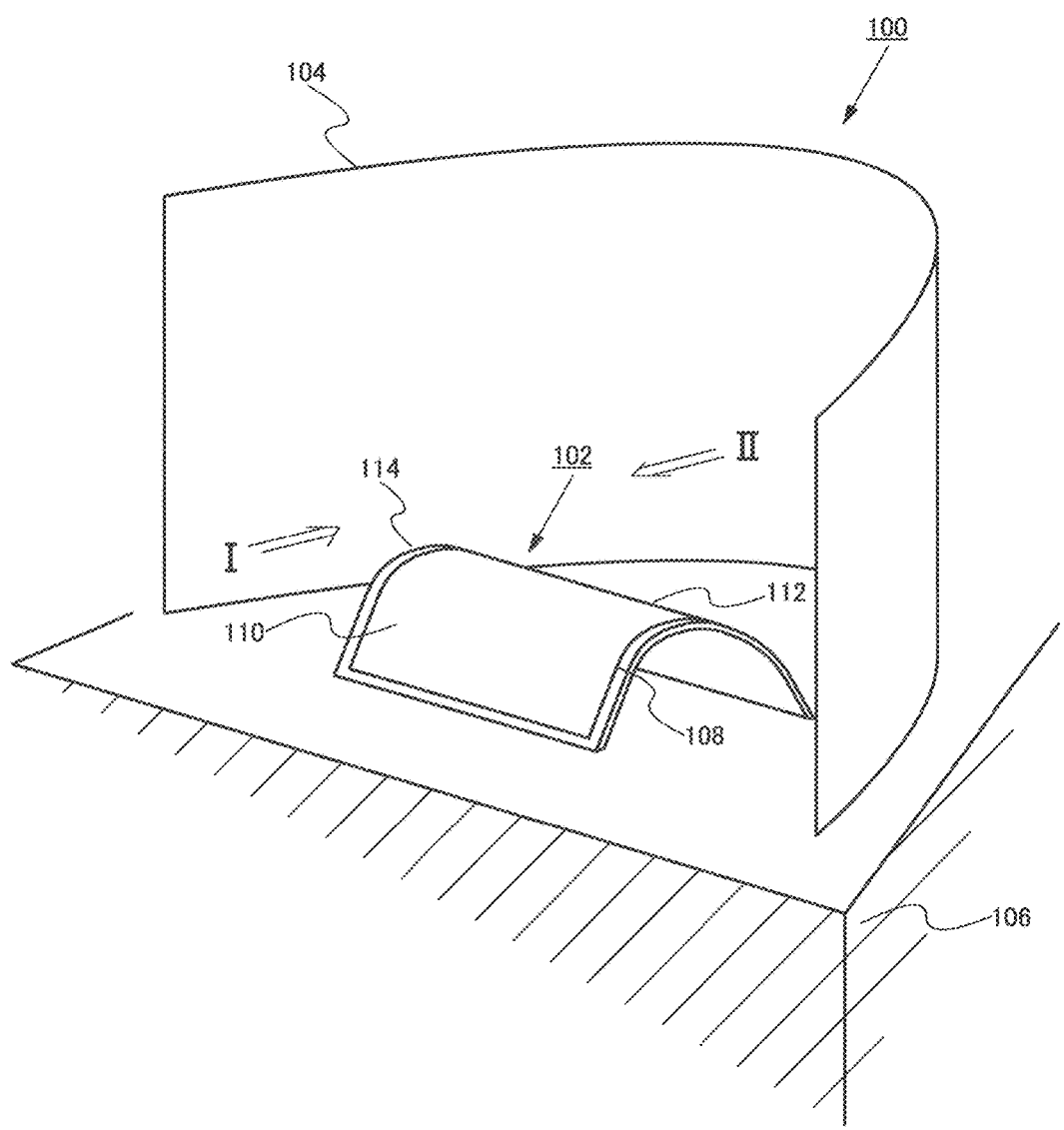
FIG. 9 is a perspective view diagram showing a structure of a display system related to one embodiment of the present invention.

FIG. 9 shows an example of a display system 100 related to one embodiment of the present invention. The display system 100 includes the display device 102 and a projection surface 104 facing the second display region 112 side of the display device 102. An image display displayed in the second display region 112 is projected on the projection surface 104. The display device 102 curves so that a convex surface is included above the display region 108. A convex part of the display region 108 corresponds to the boundary region between the first display region 110 and second display region 112, the first display region 110 being arranged on the foreground side (first side) and the second display region 112 being arranged on the rear side (second side). A curved surface in only the second display region 112 or a curved surface in the first display region 110 and second display region 112 curves in at least a height direction.

Figure 10:
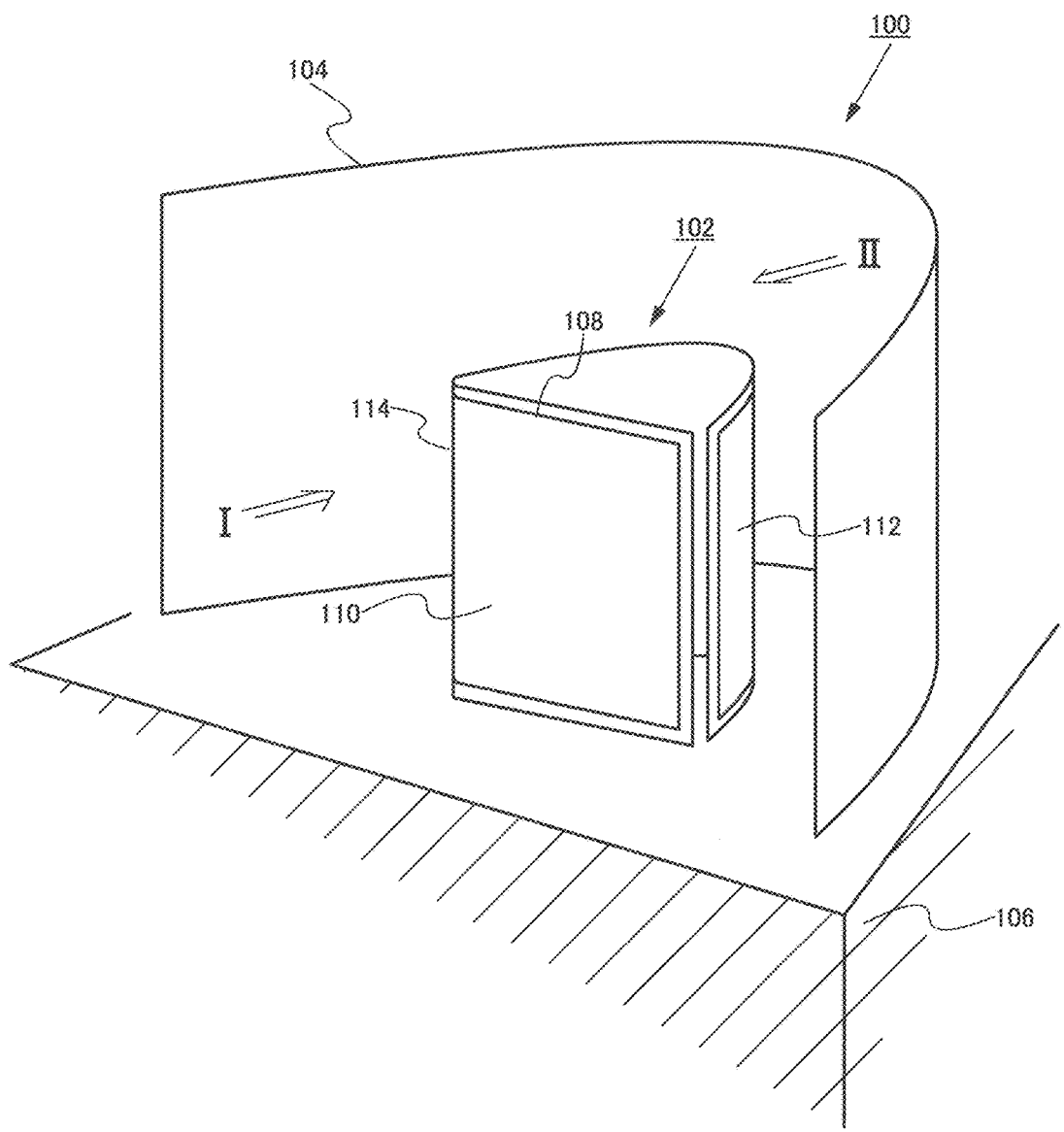
FIG. 10 is a perspective view diagram showing a structure of a display system related to one embodiment of the present invention.

FIG. 10 shows another example of the display system 100 related to one embodiment of the present invention. The display device 102 is arranged with the first display region 110 on the foreground side (first side). The display region 108 bends in a rear direction (second side) at the boundary between the first display region 110 and second display region 112, and the second display region 112 is arranged on the rear surface of the first display region 110. The projection surface 104 is arranged on the rear surface side of the second display region 112. The second display region 112 curves in a horizontal direction so as to include a convex surface.

In the display system 100 related to the present embodiment, the projection surface 104 is arranged together with the display device 102 to form a single unit and display an image. The display device 102 is arranged in a casing 106 so that at least the first display region 110 is viewed. The casing 106 may also be arranged with a drive system for supplying video signals to the display device 102 and displaying an image.

The projection surface 104 is arranged separated from the display device 102 and includes a plate shape or a curved shape so as to cover the second display region 112. The projection surface 104 is a surface onto which an image projected by the second display region 112 is copied and includes a white background, mirror surface or semi-transparent reflective surface. The projection surface 104 is formed using a screen, reflective plate or glass plate. The screen is formed using a sheet shaped component formed from a single layer or plurality of layers. For example, the screen is formed from a sheet or plate shaped component formed by stacking a white background resin layer (for example, EVA (Ethylene Vinyl Acetate Copolymer) resin) glass fiber layer, and black background resin layer from the light receiving surface side. The reflective plate is formed using a mirror formed with a silver or aluminum metal film on a rear surface of a glass plate, or a mirror polished metal plate and the like. In addition, the glass plate is formed from a component having a matt finished surface or a semi-transparent component formed with a metal semi-transparent film. The projection surface 104 can reflect an image projected from the second display region 112 using these materials, shapes and arrangements.

When the first display region 110 and second display region 112 in the display device 102 are driven simultaneously, the display system 100 can simultaneously display a direct view image and a projected image. For example, the first display region 110 displays a main image to be directly viewed and the second display region 112 projects an expanded image to form a background on the projection surface 104. In this case, a lens may be arranged between the second display region 112 and the projection surface 104. By arranging a lens, it is possible to expand and project an image to be displayed by the second display region 112 by the projection surface 104. When the first display region 110 forms a direct view screen and the second display region 112 displays a projected image in this way, it is possible to combine a direct view image with a projected image and display an integrated image. In addition, by arranging the first display region 110 which displays a direct view image in the foreground side with respect to a viewer and arranging the projection surface 104 displayed with an image from the second display region 110 at the back side, it is possible for the display system 100 to display an image with a sense of depth.

In the display device 102, the first display region 110 may also include a curved surface. By including a curved surface in the first display region 110, it is possible to widen a viewing angle of a direct view screen. Both the first display region 110 and second display region 112 in the display device 102 may also include a curved surface. In this case, the curvature of the curved surface in the second display region 112 may be set higher than the curvature of the curved surface in the first display region 110. By adopting this structure, it is possible to project an image at a wide angle in the second display region 112 without reducing visibility of a direct view image while continuing to realize a wide viewing angle in the first display region 110. By including a display surface which curves in a height direction in the first display region 110 and forming the projection surface with a display surface which curves horizontally in a concave shape, it is possible to display an image with a sense of solidity.

In the display device 102 arranged in the display system 100, the pixel pitch in the first display region 110 and second display region 112 may be different. That is, the pixel pitch in the first display region 110 is smaller compared to the second display region 112. By reducing the pixel pitch in the first display region 110, it is possible to display an image with high resolution. On the other hand, when the pixel pitch in the second display region 112 is larger than in the first display region 110, it is possible to improve an aperture ratio of a pixel, increase luminosity per pixel, and increase the contrast of an image displayed on the projection surface 104.

Furthermore, in the display device 102, the first display region 110 and second display region 112 are arranged continuously as explained in the first embodiment. In addition, the first display region 110 may include a first light emitting region and the second display region 112 may include a second light emitting region. By not including a non-light emitting region in a boundary region between the first light emitting region and the second light emitting region, it is possible to provide an integrated display region 108 to a viewer, leave a refined impression and improve design.

Furthermore, in the display system 100 shown in FIG. 9, the display region 108 in the display device 102 curves in a height direction, and in the display system 100 shown in FIG. 10, the display region 108 of the display device 100 curves in a horizontal direction. However, the present invention is not limited to this and the display region 108 may also curve in sphere shape. This is also the same with respect to the projection surface 104. Although the projection surface 104 in the display system 100 shown in FIG. 9 and FIG. 10 curves in a single direction, the present invention is not limited to this and may also include a curved surface which curves in three dimensions such as a spherical body.

This type of display system 100 may also be added with stereo audio effects using an audio system. By adding not only video but also audio effects, it is possible to realize an audio visual system with high video effects.

Figure 11:
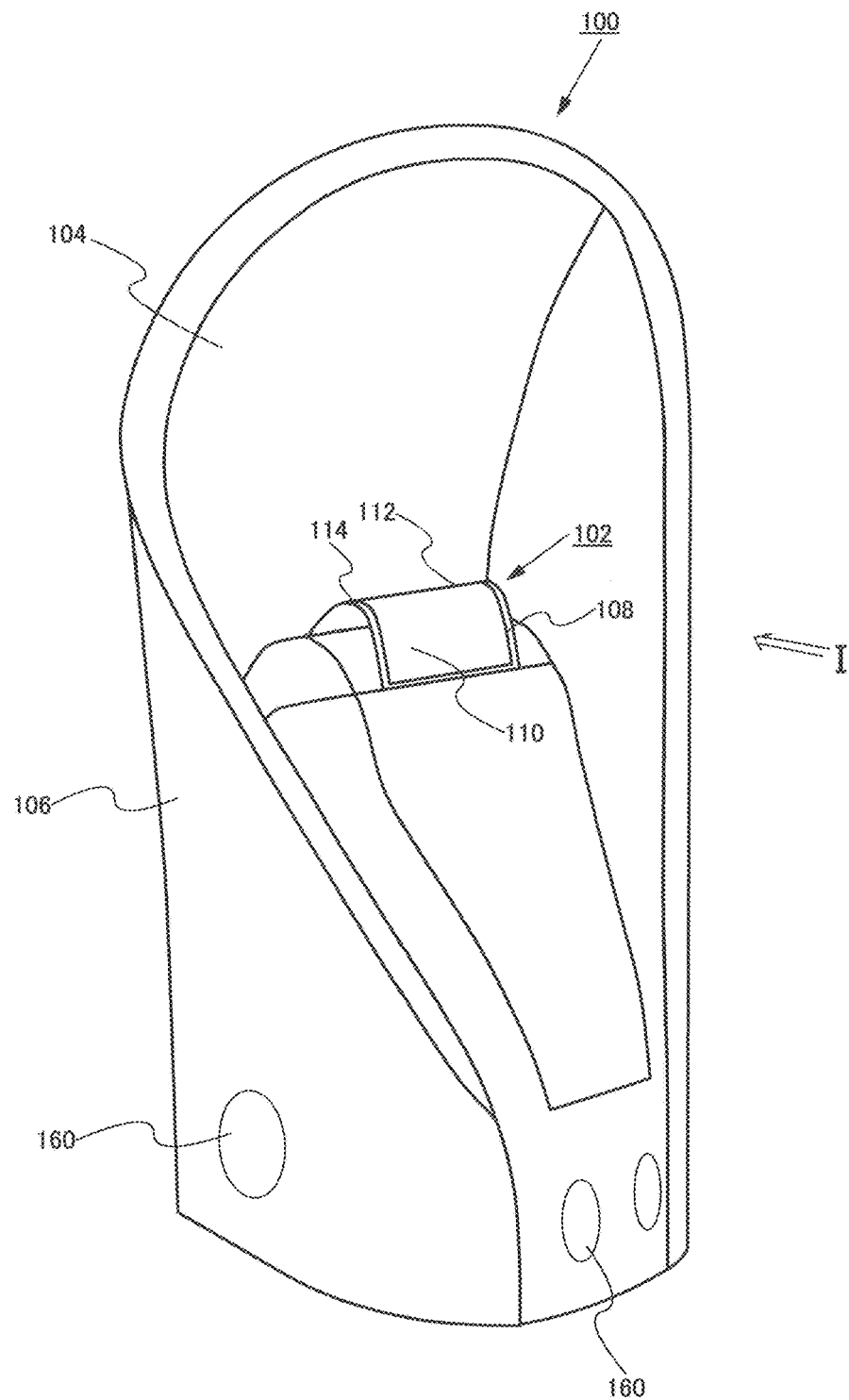
FIG. 11 is a perspective view diagram showing a structure of a display system related to one embodiment of the present invention.

FIG. 11 shows a form of the display system 100. The display system 100 is arranged with the display device 102 in the casing 106 and the projection surface 104 is arranged on the second display region 112 side so as to enclose the display device 102. In the display device 102, the first display region 110 is arranged toward the front side, the second display region 112 is arranged facing the back side. In the display device 102, the first display region 110 displays a direct view image and the second display region 112 projects an image onto the projection surface 104, thereby a display can be provided with high video effects as described previously. In addition, by arranging a speaker 160 it is possible to add audio combined with an image display.

Figure 12:
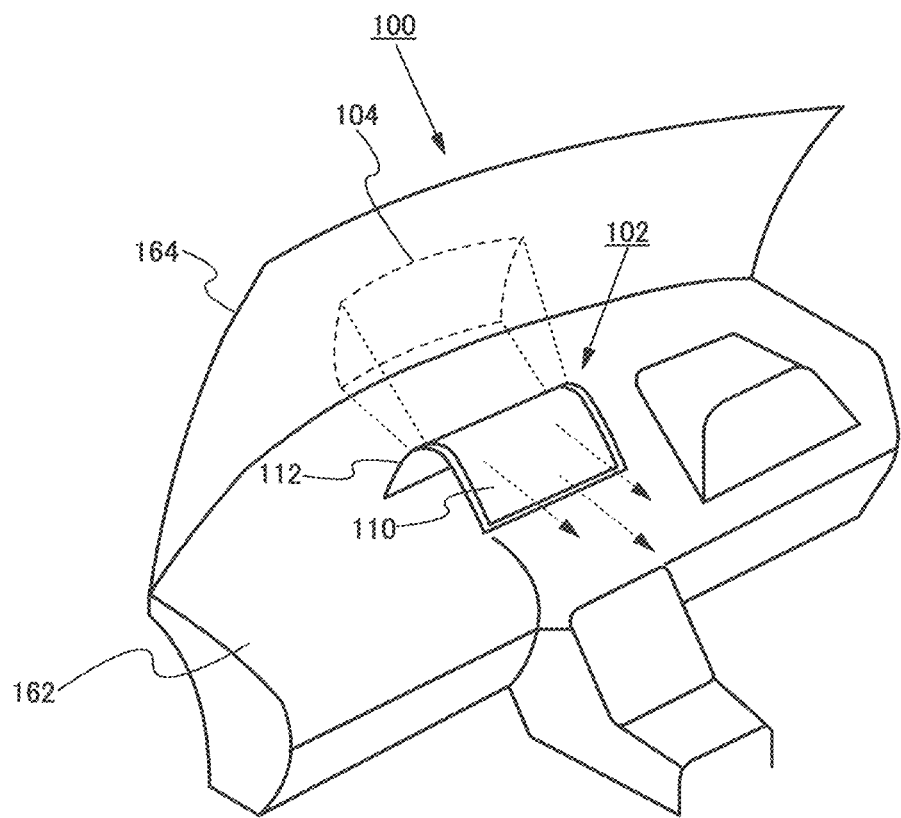
FIG. 12 is a perspective view diagram showing a structure of a display system related to one embodiment of the present invention.

FIG. 12 shows a form whereby the display device 102 is arranged in a vehicle. The display device 102 is arranged in an installment panel 162 arranged on the driver's seat. The display device 102 includes the first display region 110 and second display region 112 in the display region 108. The first display region 110 is arranged towards to the foreground side of the driver's seat and the second display region 112 is arranged towards a front window 164 on the front side of the installment panel 162.

In the display device 102, the first display region 110 displays a direct view image and the second display region 112 projects an image towards the front window 164. That is, the display system 100 is built into a vehicle by using a part of the front window 164 as the projection surface 104. The display region 110 may also include a function of a touch panel as described previously.

In the display system 100 shown in FIG. 12, the first display region 110 displays data such as detailed information of a destination or information related to surrounding facilities using characters or photographs and the second display region 112 displays map information over a wide range, thereby it is possible to provide a navigation system to a user.

In this way, according to the present embodiment, by combining a display device including a first display region and second display region sandwiching a bent part and a projection surface, it is possible to provide a display system which realizes new visual effects not conventionally available.

The display system 100 related to one embodiment of the present invention can be applied to various fields such as an information system providing various types of data to users, a navigation system mounted in a vehicle, an amusement system such as a game machine, a system for learning while browsing images, or an audio-visual system for appreciating video.

What is claimed is:

1. A display device comprising:
a display region arranged above a flexible substrate, the display region including a first display region and a second display region continuing from the first display region, at least the second display region including a curved surface; and
the second display region is located at a position where an image displayed in the second display region is not seen directly when viewing the first display region from a perpendicular direction with respect to a center part of the first display region,
wherein
the first display region includes first pixels and the second display region includes second pixels,
the first pixels include third pixels adjacent to the second display region and fourth pixels located in an opposite area of the third pixels from the second display region,
the second pixels include fifth pixels adjacent to the first display region and sixth pixels located in an opposite area of the fifth pixels from the first display region,
a size of each of the third pixels is larger than a size of each of the fourth pixels, and
a size of each of the fifth pixels is smaller than a size of each of the sixth pixels.

2. The display device according to claim 1, wherein the first display region is a flat surface and the second display region is located so that an image displayed in the second display region is not visible when viewing the first display region from a perpendicular direction with respect to the flat surface.

3. The display device according to claim 1, wherein the first display region includes a curved surface.

4. The display device according to claim 3, wherein the curved surface of the second display region has a larger curvature than the curved surface of the first display region.

5. The display device according to claim 4, wherein a curvature of a boundary region between the first display region and the second display region is the largest in the display region.

6. The display device according to claim 1, wherein the first display region and the second display region include a plurality of pixels respectively, and
a first pitch of the pixels in the first display region is different from a second pitch of the pixels in the second display region.

7. The display device according to claim 6, wherein the first pitch is smaller than the second pitch.

8. The display device according to claim 1, wherein the first display region includes a first light emitting region and the second display region includes a second light emitting region.

9. The display device according to 8, wherein a non-light emitting region is not included at a boundary between the first light emitting region and the second light emitting region.

10. A display system comprising:
a display device including a display region arranged above a flexible substrate, the display region including a first display region and a second display region continuing from the first display region and including a curved surface; and
a projection surface facing the second display region,
wherein an image display displayed in the second display region is projected on the projection surface,
the first display region includes first pixels and the second display region includes second pixels,
the first pixels include third pixels adjacent to the second display region and fourth pixels located in an opposite area of the third pixels from the second display region,
the second pixels include fifth pixels adjacent to the first display region and sixth pixels located in an opposite area of the fifth pixels from the first display region,
a size of each of the third pixels is larger than a size of each of the fourth pixels, and
a size of each of the fifth pixels is smaller than a size of each of the sixth pixels.

11. The display system according to claim 10, wherein the first display region displays a direct view image.

12. The display system according to claim 10, wherein the projection surface is a screen, reflective plate or glass plate.

13. The display system according to claim 10, wherein the first display region includes a curved surface.

14. The display system according to claim 13, wherein the curved surface of the second display region has a larger curvature than the curved surface of the first display region.

15. The display system according to claim 10, wherein the first display region and the second display region include a plurality of pixels respectively, and
a first pitch of the pixels in the first display region is different from a second pitch of the pixels in the second display region.

16. The display system according to claim 15, wherein the first pitch is smaller than the second pitch.

17. The display system according to claim 10, wherein the first display region includes a first light emitting region and the second display region includes a second light emitting region.

18. The display system according to claim 17, wherein a non-light emitting region is not included at a boundary between the first light emitting region and the second light emitting region.

* * * * *